(12) United States Patent
Murr

(10) Patent No.: US 6,921,277 B2
(45) Date of Patent: Jul. 26, 2005

(54) PROCESSOR AND HEAT SINK ACTUATION SYSTEM

(75) Inventor: Keith McQuilkin Murr, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 118 days.

(21) Appl. No.: 10/261,745

(22) Filed: Oct. 1, 2002

(65) Prior Publication Data
US 2004/0063343 A1 Apr. 1, 2004

(51) Int. Cl.⁷ .............................................. H01R 13/625
(52) U.S. Cl. ....................................... 439/342; 439/487
(58) Field of Search ................................. 439/342, 487

(56) References Cited

U.S. PATENT DOCUMENTS

| 5,256,080 | A | * | 10/1993 | Bright | 439/342 |
| 5,707,247 | A | * | 1/1998 | Konstad | 439/342 |
| 5,893,770 | A | * | 4/1999 | Gober | 439/342 |
| 6,217,361 | B1 | | 4/2001 | Murr | |
| 6,347,951 | B1 | | 2/2002 | Murr | |
| 6,362,961 | B1 | * | 3/2002 | Chiou | 361/704 |

* cited by examiner

Primary Examiner—Phuong Dinh

(57) ABSTRACT

A processor actuation system for engaging electrical contacts of a processor with mating elements of a socket. The processor actuation system comprises a socket, a processor, a heat sink and a cam actuator. The socket includes a base, an actuator-receiving member and a sliding cover. The processor includes electrical contacts extending from a surface of the processor. The processor is mounted on a processor-interface surface of the sliding cover. The heat sink mounts on at least one of the processor and the socket. The cam actuator connects to the actuator-receiving member. The cam actuator moves the sliding cover in a longitudinal direction with respect to the base, such that movement of the sliding cover along the longitudinal direction moves the processor and the heat sink along the longitudinal direction to lock the processor.

17 Claims, 8 Drawing Sheets

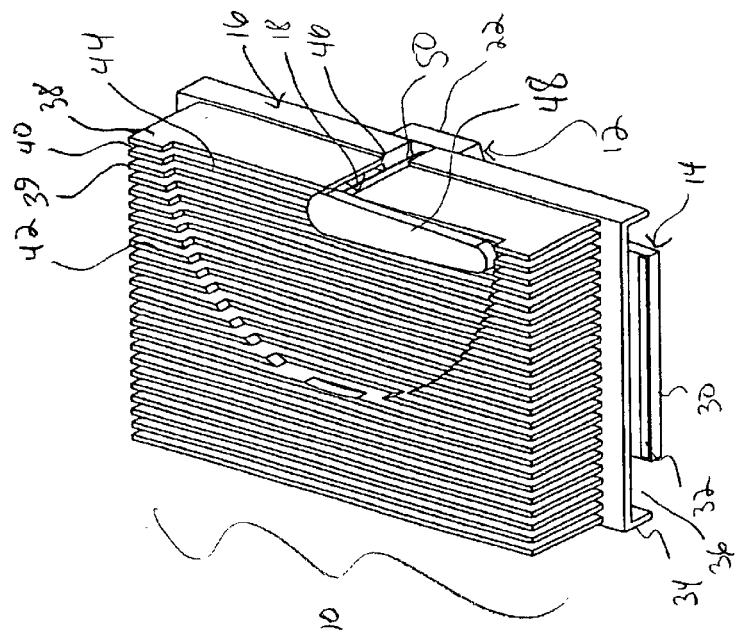

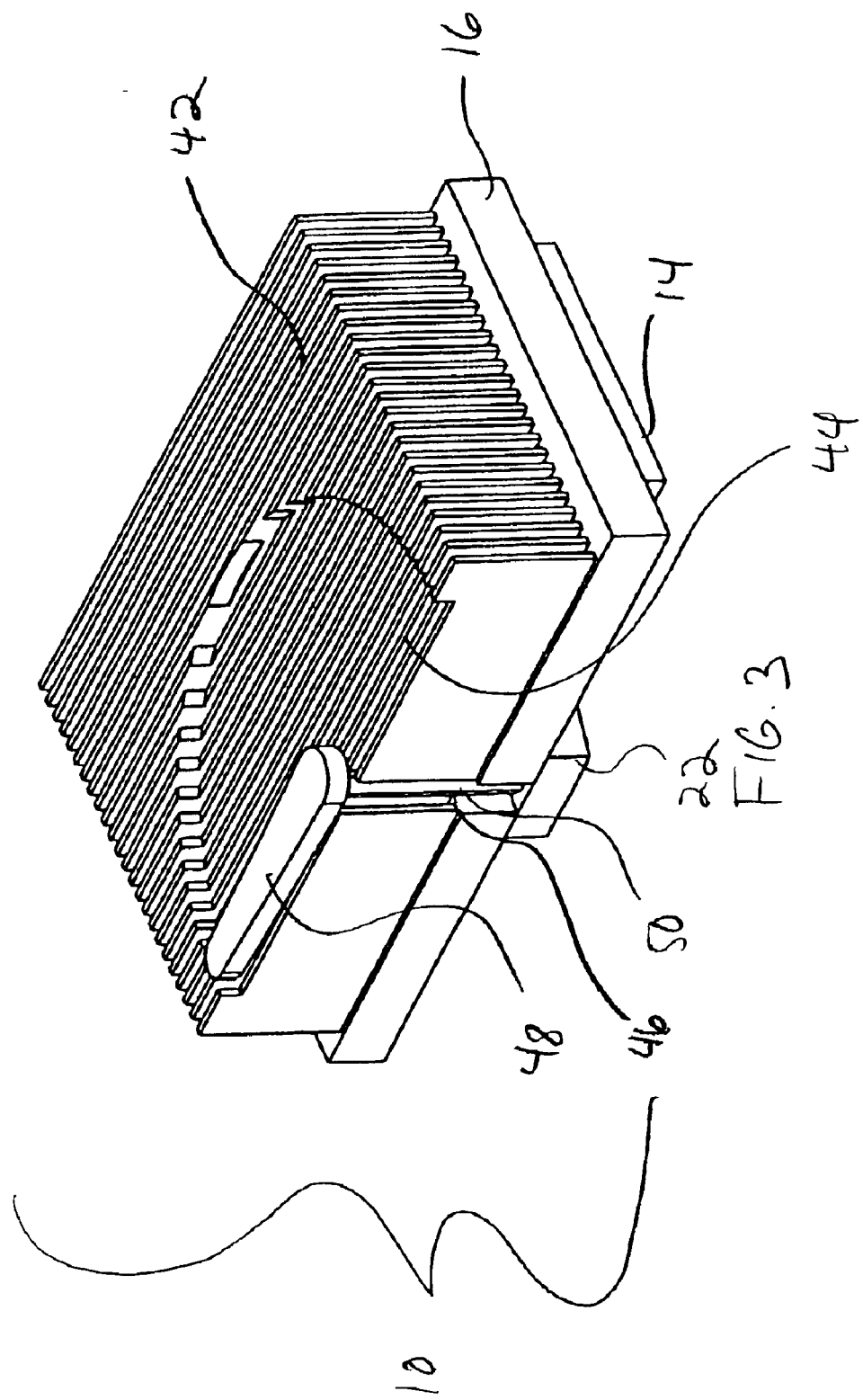

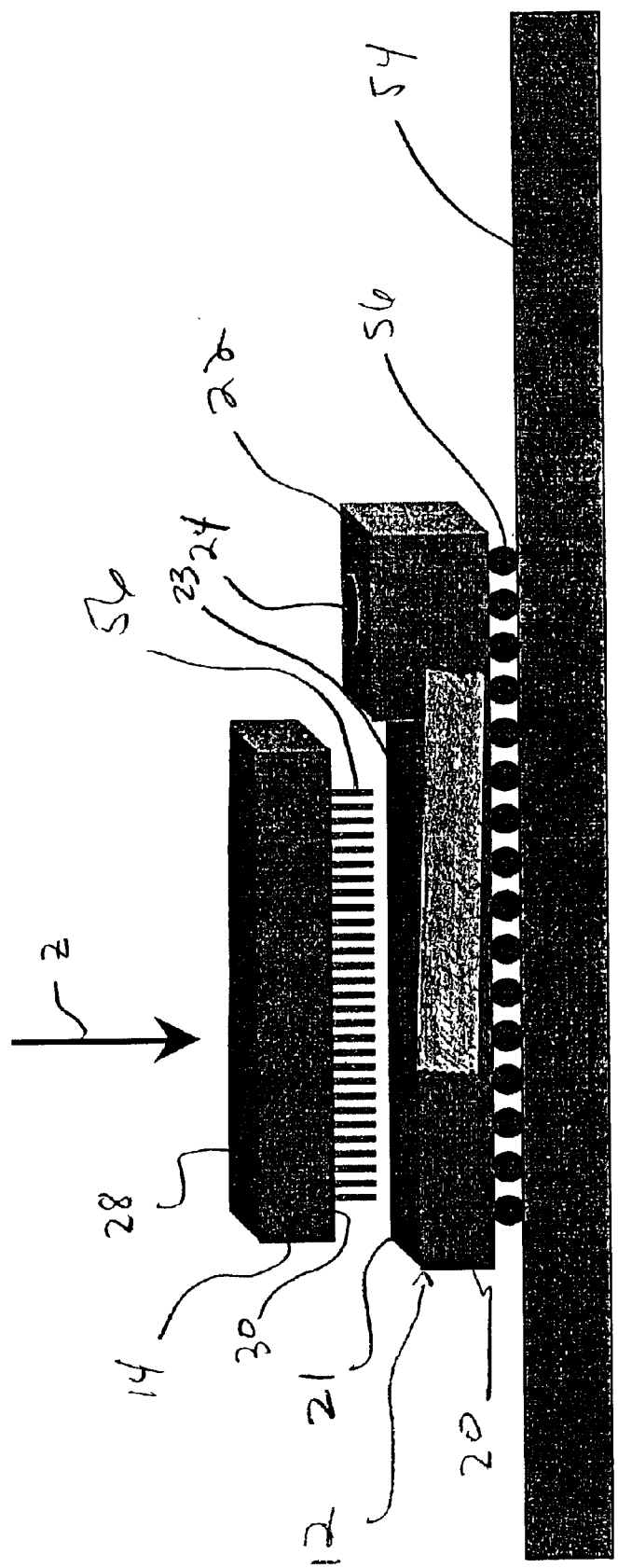

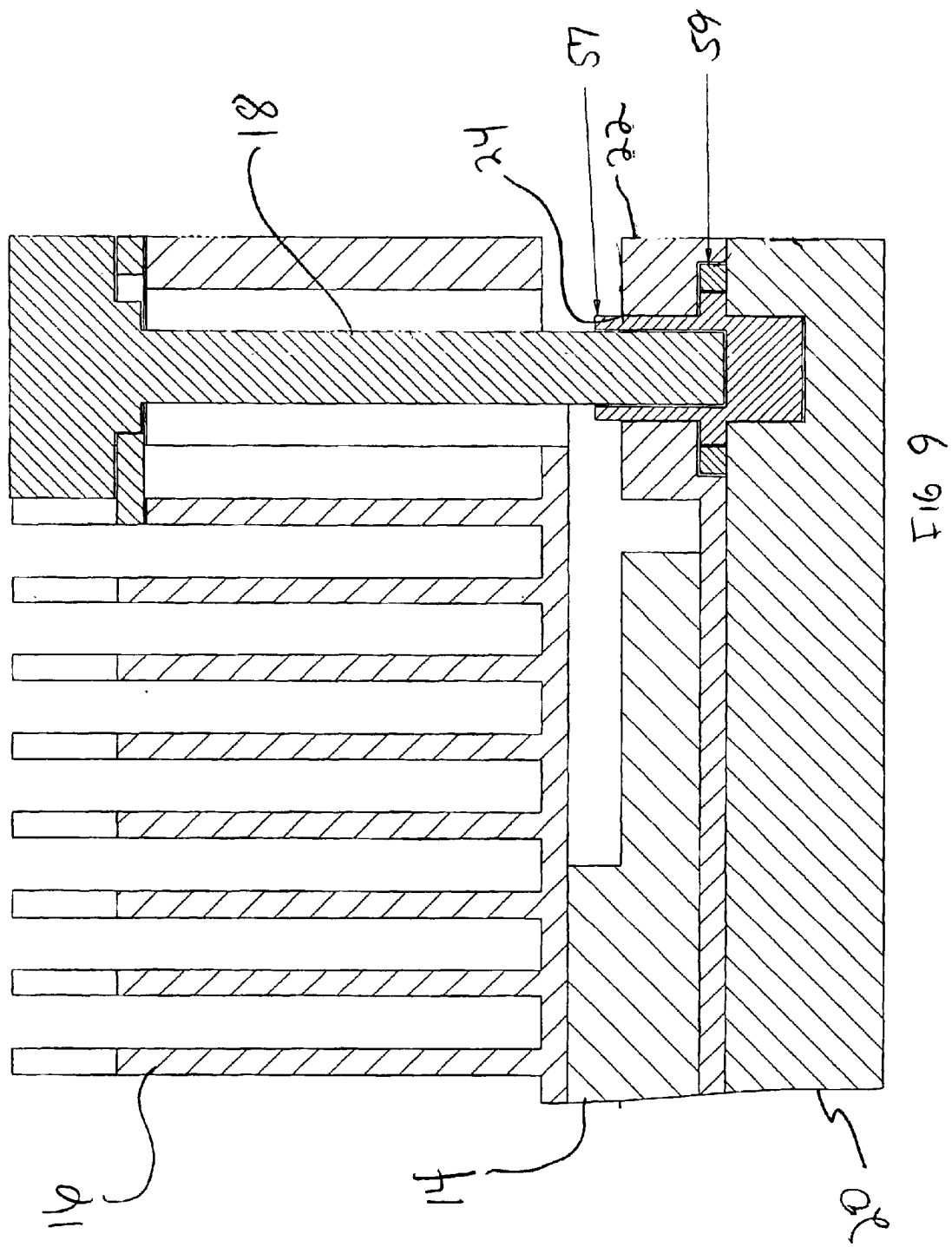

PROCESSOR AND HEAT SINK ACTUATION SYSTEM

BACKGROUND OF THE INVENTION

Certain embodiments of the present invention generally relate to a processor actuation system, and more particularly to a cam actuation system that facilitates engagement of a processor into a socket where a heat sink is mounted on the processor.

Various electronic systems, such as computers, comprise a wide array of components mounted on printed circuit boards, such as daughterboards and motherboards that are interconnected to transfer signals and power throughout the system. Often, motherboards are electrically connected to processors through sockets. Typically, heat sinks are provided to dissipate the heat generated by the transfer of electrical and power signals between the motherboard and the processor.

Servers and work stations typically include multiple sockets and a corresponding number of processors. As technological demands have increased, the servers and work stations have become bigger, hotter and faster in that an increased number of electrical connections, processors, motherboards, etc., have been utilized. Many servers and work stations include support frames, on which the motherboards are positioned. Overall, with increased performance demands, space within the servers and work stations become restricted and limited due to the presence of additional components.

Typically, each motherboard is reflow soldered to a corresponding socket. In order to establish electrical contact between contacts of the processor and mating elements within the socket (which act as an electrical conduit to electrical contacts on the motherboard), the processor is actuated in a locked position in a direction that is parallel to the plane of the socket. The actuation typically occurs through a cam actuated sliding cover on the socket.

Initially, the processor is mounted onto the sliding cover of the socket in the Z-direction. That is, the processor is essentially dropped onto the sliding cover in a direction that is perpendicular to the surface of the sliding cover. In order to mate the electrical contacts with the mating elements of the socket, however, the processor typically is actuated in a direction that is parallel to the surface of the sliding cover.

FIG. 7 illustrates an actuation step of a processor into a conventional socket. The socket 100 includes a sliding cover 102 and an actuator-receiving section 104 having a rotatable receptacle 106. The processor 108 is mounted on the socket 100 in the Z-direction. The socket 100 is mechanically and electrically connected to a motherboard 110 through solder balls 112. The rotatable receptacle 106 rotates relative to the actuator-receiving section 104. The rotatable receptacle 106 receives and retains a distal end 114 of an actuator 116, which is typically a separate tool. The distal end 114 engages a cam member within the socket 100, which operatively engages a transfer mechanism within the socket 100. The transfer mechanism is connected to the sliding cover 102 and causes the sliding cover 102 to move when the actuator 116 is fully engaged with the cam member. When the actuator 116 is rotated in the direction of arc A, the processor 108 moves in the direction of line X so that electrical contacts of the processor are mated with mating elements within the socket (thereby establishing an electrical connection between the processor 108 and the motherboard 110). Once the processor 108 is fully actuated such that electrical contacts of the processor 108 are fully mated with mating elements of the socket 100, the heat sink is mounted on the processor 108.

FIG. 8 illustrates a heat sink 118 mounted in accordance with a conventional technique. The heat sink 118 is mounted onto the processor 108 in the Z-direction only after the processor 108 has been actuated into the socket 100. Considering that space is limited within the servers and works stations, however, mounting the heat sink onto the processor 108 may be difficult. That is, there may not be enough clearance between the processor 108 and other components within the server to maneuver the heat sink 118 into position. Even if there is enough clearance, the task of maneuvering the heat sink 118 into position may prove arduous and time-consuming.

Thus, a need exists for a more efficient and simpler system and method for assembling and locking a processor into a socket.

BRIEF SUMMARY OF THE INVENTION

Certain embodiments of the present invention provide a processor actuation system for engaging electrical contacts of a processor with mating elements of a socket. The processor actuation system comprises a socket, a processor, a heat sink and a cam actuator. The socket includes a base, an actuator-receiving member and a sliding cover. The processor includes electrical contacts extending from a surface of the processor. The processor is mounted on a processor-interface surface of the sliding cover. The heat sink mounts on at least one of the processor and the socket. The cam actuator connects to the actuator-receiving member. The cam actuator moves the sliding cover in a longitudinal direction with respect to the base, such that movement of the sliding cover along the longitudinal direction moves the processor and the heat sink along the longitudinal direction to lock the processor.

Certain embodiments of the present invention also provide a method of mating electrical contacts of a processor with corresponding mating elements within a socket. The method comprises the steps of: mounting a processor on a processor-interface surface of a sliding cover of a socket so that electrical elements extending from the processor are received and retained by the sliding cover; positioning a heat sink over the processor and socket before the electrical contacts of processor are fully mated with the mating elements within the socket; and moving the sliding cover along a longitudinal direction parallel to a top surface of the sliding cover relative to a base of the socket so that the electrical elements engage corresponding mating elements within the socket, wherein said moving step comprises moving the heat sink and processor together.

BRIEF DESCRIPTION OF SEVERAL VIEWS OF THE DRAWINGS

FIG. 1 is an isometric exploded view of a processor actuation system according to an embodiment of the present invention.

FIG. 2 is an isometric view of a fully-assembled processor actuation system according to an embodiment of the present invention.

FIG. 3 is an isometric view of a fully-assembled processor actuation system according to an embodiment of the present invention.

FIG. 4 illustrates a processor being assembled onto a socket, according to an embodiment of the present invention.

FIG. 9 illustrates a cross sectional view of a processor actuation system according to an embodiment of the present invention.

Figure 5:
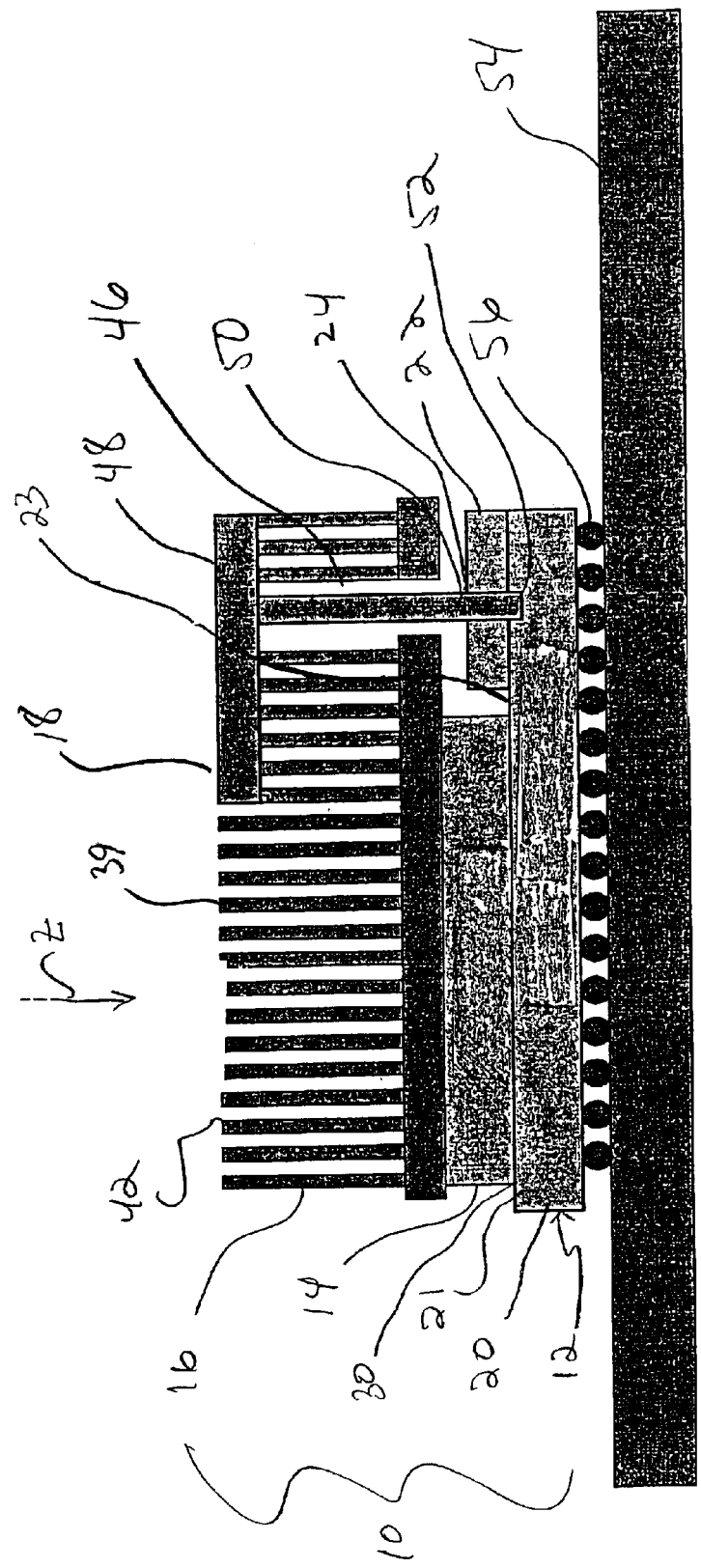
FIG. 5 illustrates a heat sink being assembled onto a processor, according to an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

FIG. 1 is an isometric exploded view of a processor actuation system 10 according to an embodiment of the present invention. The processor actuation system 10 includes a socket 12, a processor 14, a heat sink 16 and a cam actuator 18. The socket 12 includes a base 20 supporting a sliding cover 21 and an actuator-receiving section 22 having a rotatable receptacle 24, which is rotatable relative to the actuator-receiving section 22. The sliding cover 21 includes a processor-interface surface 23. The sliding cover 21 may be sunk below a top surface 26 of the actuator-receiving section 22 so that the actuator-receiving section 22 forms a ledge relative to the sliding cover 21. The sliding cover 21 receives and supports the processor 14 so that a top surface 28 of the processor 14 may be flush with the top surface 26 of the actuator-receiving section 22.

The processor 14 includes the top surface 28, a bottom or cover-interface surface 30 and a power contact strip 32. The bottom surface 30 includes electrical contacts (not shown) that mate with corresponding through-holes, cavities, or other mating elements formed on and through the sliding cover 21 of the socket 12.

The heat sink 16 includes a base 34 defining a channel 36, which covers the processor 14 and the socket 12 upon assembly of the processor actuation system 10. The base 34 supports a heat-controlling body 38 of the heat sink 16. The heat-controlling body 38 includes a plurality of fins 39 defining air passages 40 therebetween. The heat sink 16 also includes a top surface 42 and a recessed handle clearance area 44, which is formed within the top surface 42. That is, the recessed handle clearance area 44 is recessed, or sunk below, the plane of the top surface 42. The fins 39 are arranged parallel to one another, such that a group of the fins 39 have upper edges with notched-out portions arranged proximate one another to define the recessed handle clearance area 44 that receives the cam actuator 18. The cam actuator 18 is movable along an arcuate path within the recessed handle clearance area 44.

The recessed handle clearance area 44 is defined by upper edges of the fins 39. That is, the recessed handle clearance area 44, which may be semicircular, spans over truncated portions of a plurality of fins 39 and a portion of air passages 40 defined therebetween. An actuator channel 46, which receives the cam actuator 18, is formed in the side of the heat sink 16. As shown in FIG. 1, the actuator channel 46 may be formed within a lateral surface 47 of the heat sink 16, extending from the top surface 42 through a bottom surface 49 of the heat sink 16. That is, the actuator channel 46 extends through the heat sink 16.

The cam actuator 18 includes a handle 48 and rod 50 formed integrally with one another. The handle 48 and rod 50 may be formed perpendicularly with respect to one other. The rotatable receptacle 24 is configured to receive a distal end 52 of the rod 50. Both the rod 50 and the rotatable receptacle 24 may be formed in the shape of a hexagon. Alternatively, the rod 50 and the rotatable receptacle 24 may be any shape that allows the rod 50 to frictionally engage the rotatable receptacle 24 so that the actuation of the cam actuator 18 causes rotation of the rod 50, and therefore, responsive rotation of the rotatable receptacle 24.

Optionally, the handle 48 and rod 50 may be formed at various angles with respect to one another. Also, the cam actuator 18 may be formed in the shape on an "L," as shown in FIG. 1, or a "T," or various other shapes or sizes. As shown in FIG. 1, the cam actuator 18 is distinct and separate from the heat sink 16. However, the cam actuator 18 may be formed with, or a part of, the heat sink 16.

FIGS. 2 and 3 are isometric views of a fully-assembled processor actuation system 10 according to an embodiment of the present invention. In order to assemble the processor actuation system 10, the processor 14 is positioned on the sliding cover 21. Electrical contacts extending from the processor 14 are received in cavities formed in the sliding cover 20. After the processor 14 is positioned on the sliding cover 21, the heat sink 16 is positioned over the processor 14 and the socket 12. The actuation channel 46 of the heat sink 16 is positioned over the rotatable receptacle 24 so that the rod 50 may be received and retained in the receptacle 24. The cam actuator 18 may be manufactured as part of the heat sink 16, or may be a separate component that is inserted into the actuator channel 46 after the heat sink 16 is positioned over the processor 14 and the socket 12.

Upon assembly, the handle 48 of the cam actuator 18 is positioned within the recessed handle clearance area 44 of the heat sink 16. The handle 48 is flush, or substantially flush, with the top surface 42 of the heat sink 16. Thus, the outer envelope of the cam actuator 18 does not extend past the outer envelope of the heat sink 16. That is, upon assembly, the height of the handle 48 does not exceed the height of the top surface 42 of the heat sink 16.

Once the end rod 50 of the cam actuator 18 is received and retained in the rotatable receptacle 24, the distal end 52 of the road 50 engages a cam within the socket 12. FIG. 9 shows the cam 57 positioned within the receptacle 24 of the actuator-receiving section 22. A wear plate 59 may also be positioned around the cam 57. The actuator 18 is received and retained by the cam 57 within the receptacle 24. Actuation of the cam 57 causes the sliding cover 21 to slide relative to the base 20. For example, the sliding cover 21 may be positioned on guide tracks, bearings, or the like, which are operatively connected to the cam 57. As the cam actuator 18 is rotated, the cam 57 is engaged by the distal end 52 of the cam actuator 18, thereby causing the sliding cover 21 to slide relative to the base 20.

FIG. 4 illustrates the processor 14 being assembled onto the socket 12. The socket 12 is electrically connected to a motherboard 54 through solder balls 56, or reflow soldering. The processor 14 is mounted onto the sliding cover 21 in the Z-direction. Electrical contacts 56 extending from a bottom surface of the processor 14 are received and retained by cavities (not shown) formed within the sliding cover 21.

FIG. 5 illustrates the heat sink 16 being assembled onto the processor 14. As shown in FIG. 5, the handle 48 of the cam actuator 18 is flush with the top surface 42 of the heat sink 16. As mentioned above, the cam actuator 18 may be a built-in component of the heat sink 16, or may be a separate and distinct component. The heat sink 16 is mounted on the processor 14 in the Z-direction. The actuator channel 46 of the heat sink 16 is positioned so that the rod 50 of the cam actuator 18 may be received and retained by the rotatable receptacle 24 of the actuator-receiving section 22. Once the cam actuator 18 is positioned within the processor actuation system 10, the distal end 52 of the rod 50 engages a cam within the socket 12. As discussed above, the cam may be operatively connected to guide tracks, bearings or the like positioned within the socket 12 that allow the sliding cover 21 to slide relative to the base 20.

Figure 6:
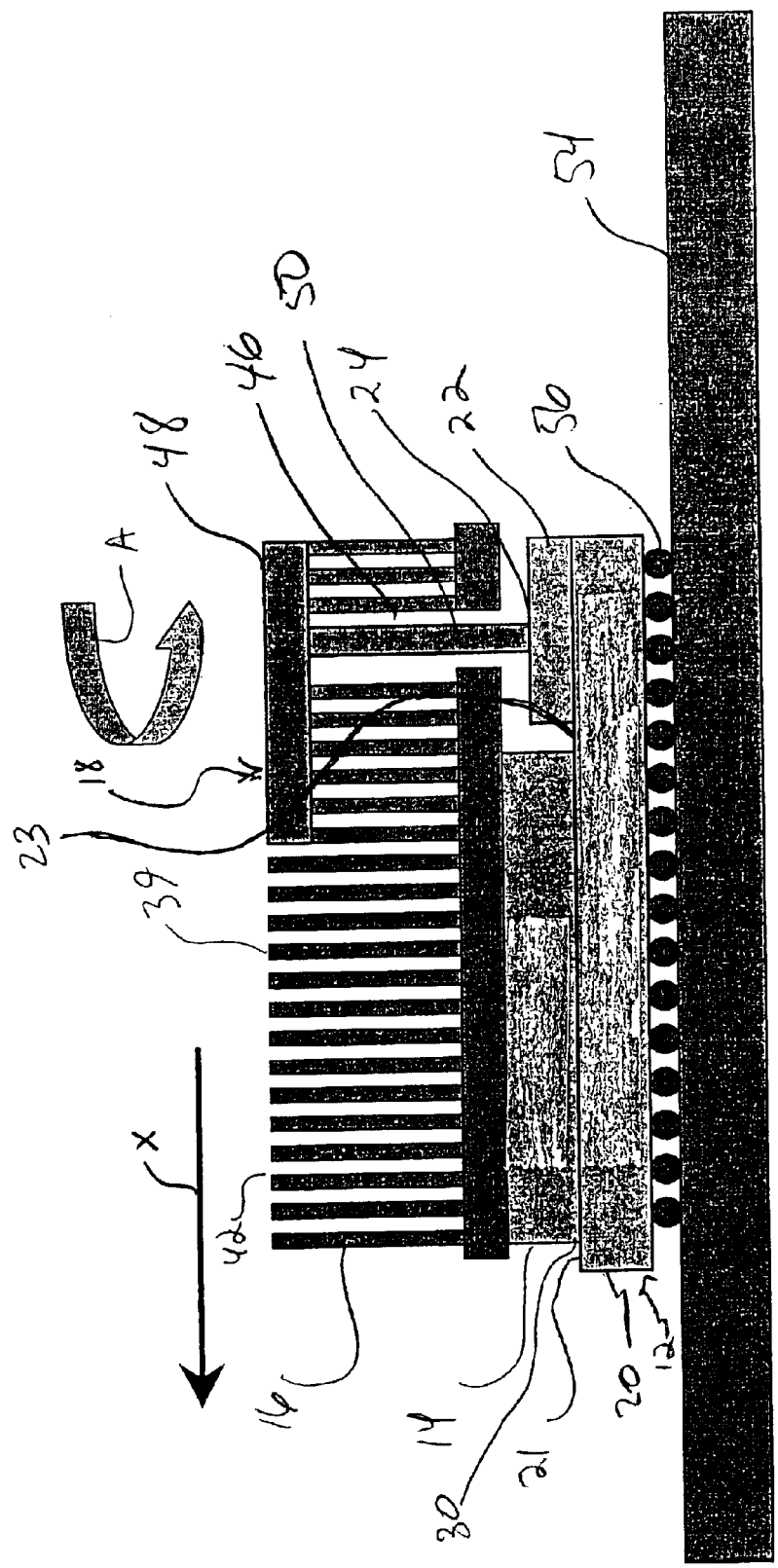
FIG. 6 illustrates a heat sink, a processor and a socket being joined, according to an embodiment of the present invention.
Figure 7:
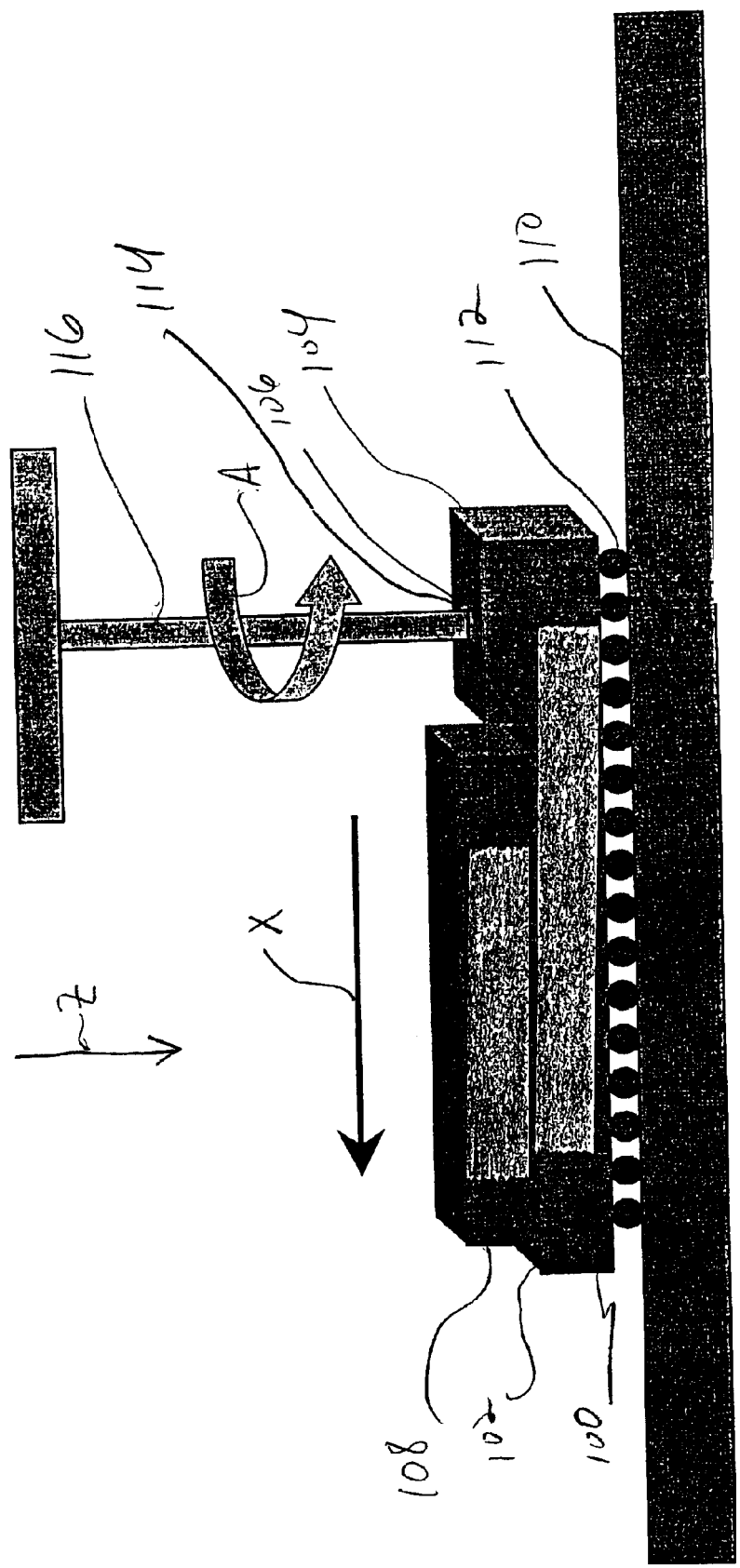
FIG. 7 illustrates a processor and socket assembled according to a conventional method.
Figure 8:
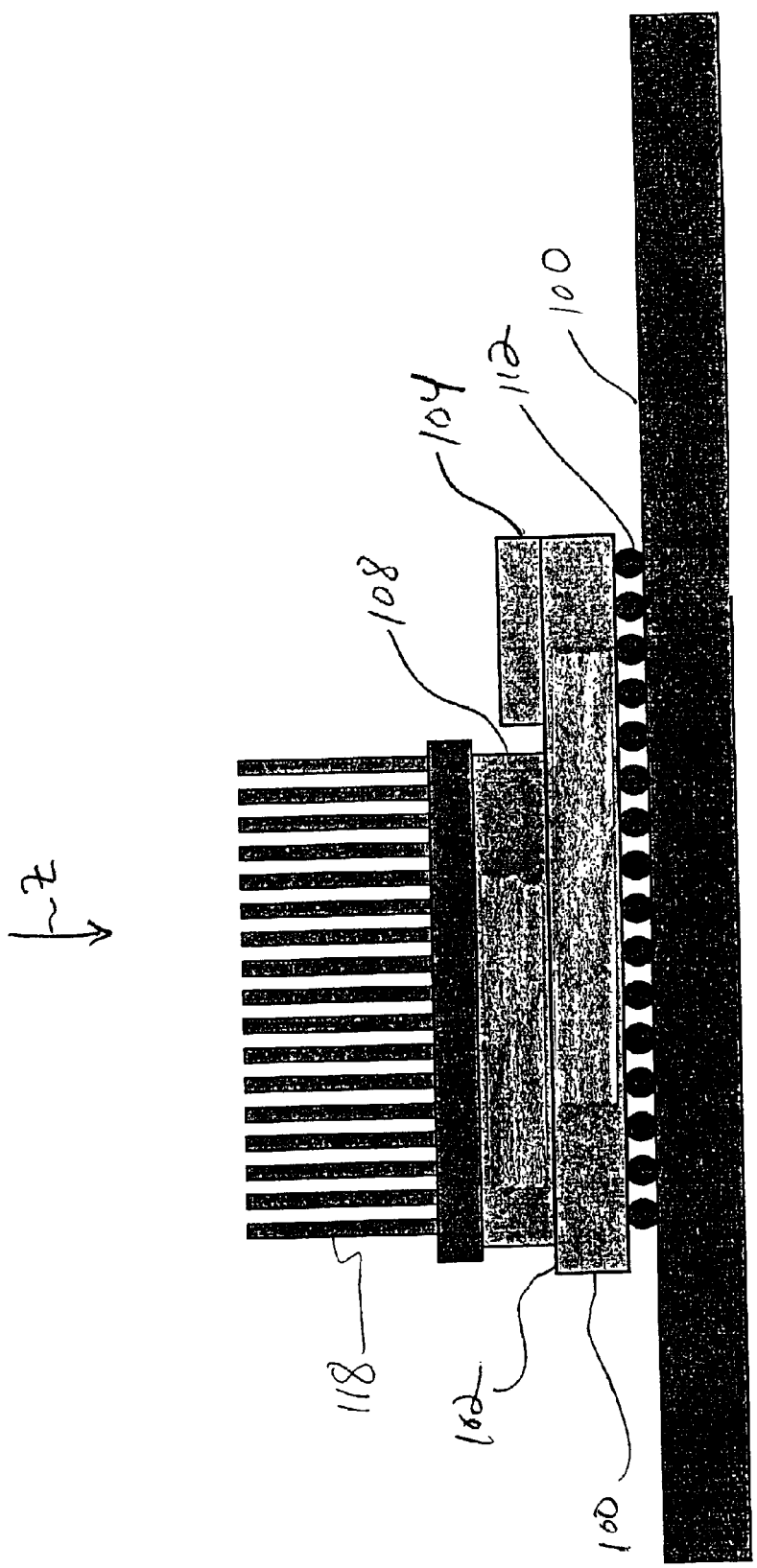
FIG. 8 illustrates a conventional heat sink mounting step.

FIG. 6 illustrates the heat sink 16 and the processor 14 being locked into the socket 12, according to an embodiment of the present invention. In order to mate the electrical contacts 56 of the processor 14 into corresponding contacts within the socket 12, the handle 48 of the cam actuator 18 is rotated in the direction of arc A. The rotation of the handle 48 through the recessed handle clearance area 44 causes a corresponding rotation in the rod 50. The rotation of the rod 50 causes the cam 57 within the socket 12 to operatively engage the guide tracks, bearings or the like within the socket 12, causing them to move in an X-direction, which is parallel to the cover-interface surface 30 and the processor interface surface 23. The movement of the guide tracks, bearings or the like in the X-direction causes the sliding cover 21 to move in the X-direction. The sliding cover 21 moves, or slides, relative to the base 20 of the socket and the actuator-receiving section 22. That is, while the sliding cover 21 moves, the base 20 and the actuator-receiving section 22 remain stationary.

As the sliding cover 21 moves in the X-direction, the processor, which is mounted on the sliding cover 21, also moves in the X-direction. Further, because the heat sink 16 is mounted on the processor 14, the heat sink 16 also moves in the X-direction as the sliding cover 21 moves in the X-direction. Thus, movement of the sliding cover 21 causes a corresponding movement in the processor 14 and the heat sink 16. While the heat sink 16 moves, the rod 50 of the cam actuator 18, while rotating, remains stationary with respect to the X-direction. As the sliding cover 21, processor 14 and heat sink 16 are moved in the X-direction, the electrical contacts 56 extending from the processor 14 (and positioned within channels of the sliding cover 21) are shifted in the X-direction and engage corresponding electrical contacts within the socket 12.

In order to disengage the electrical contacts 56 from the electrical contacts within the socket 12, the handle 48 of the cam actuator 18 is rotated in a direction that is opposite to arc A. Consequently, the sliding cover 21, processor 14 and heat sink 16 move in response to the rotation of the handle 48 in a direction opposite to X.

Overall, embodiments of the present invention may be used with any electrical socket connector that utilizes a cam actuation system to mate electrical contacts of a processor with those of the socket connector. Various types and configurations of processor, heat sinks, sockets and cam actuators may be used with respect to embodiments of the present invention. Additionally, a push button cam actuator may be used in lieu of the cam actuator 18.

Embodiments of the present invention provide a system and method for efficiently assembling and actuating a processor into a socket. The efficiency of the system and method is due to the fact that the heat sink is mounted on the processor and is moved along with the processor, thereby eliminating the need to drop the heat sink onto the processor after the processor has been actuated into the socket.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A processor actuation system for engaging electrical contacts of a processor with mating elements of a socket, said processor actuation system comprising:

a socket having a base, an actuator-receiving section and a sliding cover;

a processor having electrical contacts extending from a surface of said processor, said processor being mounted on a processor-interface surface of said sliding cover;

a heat sink mounted on at least one of said processor and said socket; and a cam actuator connected to said actuator-receiving section, said cam actuator moving said sliding cover in a longitudinal direction with respect to said base, wherein movement of said sliding cover along said longitudinal direction moves said processor and said heat sink along said longitudinal direction, wherein said heat sink includes a top surface having a cam actuator clearance area formed therein and wherein said cam actuator includes a handle positioned in and rotatable along said clearance area such that said handle is flush with said top surface.

2. The processor actuation system of claim 1 wherein said actuator-receiving section includes a rotatable receptacle and said cam actuator include, a handle and a rod, said rotatable receptacle receiving and retaining maid rod, said handle rotating said rod.

3. The processor actuation system of claim 1, wherein said heat sink includes fins arranged parallel to one another, wherein a group of said fins have upper edges with notched-out portions arranged proximate one another to define said clearance area that receives said cam actuator.

4. The processor actuation system of claim 1, wherein said heat sink has a channel therethrough and aligned with a receptacle in said actuator-receiving section.

5. The processor actuation system of claim 1, wherein clearance has a semicircular shape.

6. A processor actuation system for engaging electrical contacts of a processor with mating elements of a socket, said processor actuation system comprising:

a socket having a base, an actuator-receiving section and a sliding cover;

a processor having electrical contacts extending from a surface of said processor, said processor being mounted on a processor-interface surface of said sliding cover;

a heat sink mounted on at least one of said processor and said socket; and a cam actuator connected to said actuator-receiving section, said cam actuator moving said sliding cover in a longitudinal direction with respect to said base, wherein movement of said sliding cover along said longitudinal direction moves said processor and said heat sink along said longitudinal direction, wherein said heat sink includes fins having notched-out portions that define a clearance area, said cam actuator being movable along an arcuate path within said clearance area.

7. The processor actuation system of claim 6, wherein said cam actuator includes a handle positioned in and rotatable along said clearance area such that said handle is flush with said top surface.

8. The processor actuator system of claim 6 wherein said fins are arranged parallel to one another.

9. The processor actuation system of claim 6, wherein said clearance area has a semicircular shape.

10. A connector assembly, comprising:

a socket having a base configured to be mounted to a circuit board and having a cover configured to receive a processor, said cover and base being slidably mounted to one another;

a cam assembly housed in said socket for driving said base and cover between open and closed positions; and a cam actuator having a distal end removably mounted to said cam assembly, said cam actuator being rotatable about a pivot axis, said cam actuator having a handle located remote from said distal end, said handle being positioned a distance from said cover sufficient to permit the processor and the heat sink to be located between said handle and said cover, said handle being rotated from said open position to said closed position after the processor and the heat sink are mounted to said socket, wherein said handle is configured to rotate through a clearance area formed in fins within the heat sink.

11. The connector assembly of claim 10, wherein said handle rotates through a semicircular arc between said open and closed positions, said arc being oriented parallel to said cover and being positioned a distance above said cover sufficient to move within said clearance area formed in the heat sink.

12. A heat sink configured to be used with an electrical socket having a socket base, a cover and a cam actuator, wherein one of the socket base and cover is configured to receive a processor and wherein the cam actuator moves the cover and socket base relative to one another to close the socket, the heat sink comprising:

a heat sink base configured to be mounted on a processor; and heat sink fins extending upward from said heat sink base, a group of said heat sink fins having upper edges with notched-out portions, said notched-out portions being arranged proximate one another to define a cam actuator clearance area, said cam actuator clearance area being configured to receive the cam actuator as the cam actuator rotates along said cam actuator clearance area when closing the socket.

13. The heat sink of claim 12, wherein said cam actuator clearance area has a semicircular shape.

14. The heat sink of claim 13, wherein said heat sink includes a channel there though, said channel aligning with a receptacle in an actuator receiving section of the socket, said channel being configured to receive the cam actuators.

15. The heat sink of claim 13, wherein said heat sink includes an open-sided channel formed within a lateral surface of said heat sink, said channel extending from a top surface to a bottom surface of said heat sink.

16. The heat sink of claim 13, wherein said fins are arranged parallel to one another.

17. The heat sink of claim 13, wherein said cam actuator clearance area opens onto a side of said heat sink.

* * * * *